(12) United States Patent
Mateescu et al.

(10) Patent No.: US 9,754,682 B2
(45) Date of Patent: Sep. 5, 2017

(54) IMPLEMENTING ENHANCED PERFORMANCE WITH READ BEFORE WRITE TO PHASE CHANGE MEMORY

(71) Applicant: Western Digital Technologies, Inc., San Jose, CA (US)

(72) Inventors: Robert Eugeniu Mateescu, San Jose, CA (US); Dejan Vucinic, San Jose, CA (US); Cyril Guyot, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 182 days.

(21) Appl. No.: 14/084,483

(22) Filed: Nov. 19, 2013

(65) Prior Publication Data

US 2015/0143187 A1 May 21, 2015

(51) Int. Cl.
| | | |
|---|---|---|
| *G06F 11/00* | (2006.01) | |
| *G06F 11/08* | (2006.01) | |
| *G11C 29/42* | (2006.01) | |
| *G11C 29/52* | (2006.01) | |
| *G11C 16/26* | (2006.01) | |
| *G11C 29/08* | (2006.01) | |
| *G11C 29/44* | (2006.01) | |
| *G11C 13/00* | (2006.01) | |
| *G06F 11/10* | (2006.01) | |
| *G11C 11/00* | (2006.01) | |

(52) U.S. Cl.
CPC .......... *G11C 29/42* (2013.01); *G06F 11/1048* (2013.01); *G11C 13/0004* (2013.01); *G11C 29/08* (2013.01); *G11C 29/44* (2013.01); *G11C 11/005* (2013.01); *G11C 2013/0076* (2013.01)

(58) Field of Classification Search
CPC . G11C 29/42; G11C 29/44; G11C 2013/0076; G11C 29/52; G11C 11/5628; G11C 29/00; G06F 11/1076; G06F 11/1008; G06F 11/167; G06F 11/1048; G06F 11/1012; G06F 11/1044; G06F 11/00; G06F 2212/1016; H03M 13/2906; H03M 13/2927; H03M 13/35
See application file for complete search history.

(56) References Cited

U.S. PATENT DOCUMENTS

| | | | |
|---|---|---|---|
| 7,234,097 B1 * | 6/2007 | Feng | ................. G11B 20/1833 714/758 |
| 7,590,918 B2 | 9/2009 | Parkinson | |
| 8,028,216 B1 * | 9/2011 | Yeo | ....................... H03M 5/145 714/755 |
| 8,156,400 B1 * | 4/2012 | Yeo | ....................... H03M 5/145 714/758 |

(Continued)

FOREIGN PATENT DOCUMENTS

WO WO 2012039983 A1 3/2012

*Primary Examiner* — Phung M Chung
(74) *Attorney, Agent, or Firm* — Patterson & Sheridan, LLP

(57) ABSTRACT

A method and apparatus are provided for implementing enhanced performance with read before write to phase-change-memory. Each write to PCM is preceded by a read and a calculation to discover a location of any bad bits. The write data is converted to a format that can be corrected for a given number of previously undiscovered bit errors, and the writes are unverified.

17 Claims, 5 Drawing Sheets

(56) References Cited

U.S. PATENT DOCUMENTS

| | | | |
|---|---|---|---|
| 8,255,764 B1 * | 8/2012 | Yeo | H03M 5/145 |
| | | | 714/758 |
| 8,255,765 B1 * | 8/2012 | Yeo | H03M 5/145 |
| | | | 714/758 |
| 8,301,977 B2 | 10/2012 | Jagasivmani et al. | |
| 8,699,266 B2 * | 4/2014 | Bandic | G11C 11/5678 |
| | | | 365/148 |
| 9,047,211 B2 * | 6/2015 | Wood | G11C 16/349 |
| 9,293,198 B2 * | 3/2016 | Krebs | G11C 13/0004 |
| 2003/0191888 A1 * | 10/2003 | Klein | G06F 1/3225 |
| | | | 711/105 |
| 2010/0115376 A1 * | 5/2010 | Shalvi | G06F 11/1068 |
| | | | 714/763 |
| 2011/0240943 A1 | 10/2011 | Gordon et al. | |
| 2012/0144269 A1 | 6/2012 | Baker | |
| 2013/0268822 A1 * | 10/2013 | Manoochehri | G06F 11/1064 |
| | | | 714/758 |
| 2014/0082454 A1 * | 3/2014 | Eisenhuth | G06F 11/1012 |
| | | | 714/763 |
| 2014/0132616 A1 * | 5/2014 | Han | G09G 5/399 |
| | | | 345/547 |

* cited by examiner

IMPLEMENTING ENHANCED PERFORMANCE WITH READ BEFORE WRITE TO PHASE CHANGE MEMORY

FIELD OF THE INVENTION

The present invention relates generally to the data storage field, and more particularly, relates to a method and apparatus for implementing enhanced performance with read before write to phase-change-memory (PCM) to avoid the penalty of double write latency.

DESCRIPTION OF THE RELATED ART

Phase-change-memory (PCM) is a promising medium for next generation non-volatile solid-state storage. One of the idiosyncrasies of PCM is the much longer time required to write a bit than to read it: write operations are about fifty times slower than reads.

As the PCM substrate ages it develops bit errors, e.g. some bits may get stuck at 1 or 0. Similar to flash memory-based devices, some kind of error correction codes must be used, for example, BCH codes, to ensure data integrity of writes to PCM. In coding theory the BCH codes form a class of cyclic error-correcting codes that are constructed using finite fields. Since the location of a stuck bits does not change after the defect appears, it is beneficial to detect this location and use coding schemes that can take advantage of this knowledge. Such coding schemes are said to use side information at the encoder. The advantage of using side information at the encoder, such as the location of errors, is that the redundancy required to correct the error may be significantly smaller, therefore allowing the coding scheme with side information to tolerate a larger number of errors with a given redundancy ratio, compared with a coding scheme that does not have the side information. Such schemes are therefore very important for prolonging the life of the device.

A typical procedure with older types of memories that allows the discovery of stuck bits would be to write a block, read it back, perform some calculation to verify integrity or discover which bits are stuck, then write the corrected block again if there were errors providing data integrity of writes to PCM. In fact, in the worst case, if all the stuck bits need to be discovered, two physical writes and reads may be needed (for example writing all 0's and checking which locations are stuck at 1, and then writing all 1's and checking which locations are stuck at 0), before finally encoding the user data and using a third physical write to store it in PCM. With PCM avoiding this double-write, or triple-write, in the worst case, is particularly desirable because of the very long write latency.

A need exists to provide an effective and efficient mechanism for implementing PCM data write, for example, for solid state drives (SSDs).

SUMMARY OF THE INVENTION

Aspects of the present embodiments are to provide a method and apparatus for implementing enhanced performance with read before write to phase-change-memory (PCM). Other important aspects are to provide such method and apparatus substantially without negative effect and that overcome some of the disadvantages of prior art arrangements.

In brief, a method and apparatus are provided for implementing enhanced performance with read before write to phase-change-memory. Each write to PCM is preceded by a read and a calculation to discover a location of any bad bits. The write data is converted to a format that can be corrected for a given number of previously undiscovered bit errors, and the writes are unverified.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

In accordance with features of preferred embodiments, a method and apparatus are provided for implementing enhanced performance including enhanced data write to phase change memory, for example, for solid state drives (SSDs). The enhanced data write is implemented using a read before writing data to the phase change memory of preferred embodiments.

In accordance with features of the preferred embodiments, every write to phase change memory (PCM) is preceded by a read and a calculation that discovers the location of bad bits. This advantageously is accomplished by using a coding scheme with side information at the encoder, which encodes the exact location of the stuck positions.

In accordance with features of preferred embodiments, the written data is not corrected for newly arising bit errors with the data write. Writes are unverified but the data to be written is converted to a format that can be corrected for a given number of previously undiscovered bit errors. This can be accomplished by using an additional code such as BCH to protect against random errors (that are not stuck bits).

In accordance with features of preferred embodiments, the written data is maintained without reading of the data written and performing a second data write correcting any newly arising bit errors with the data write.

Figure 1:
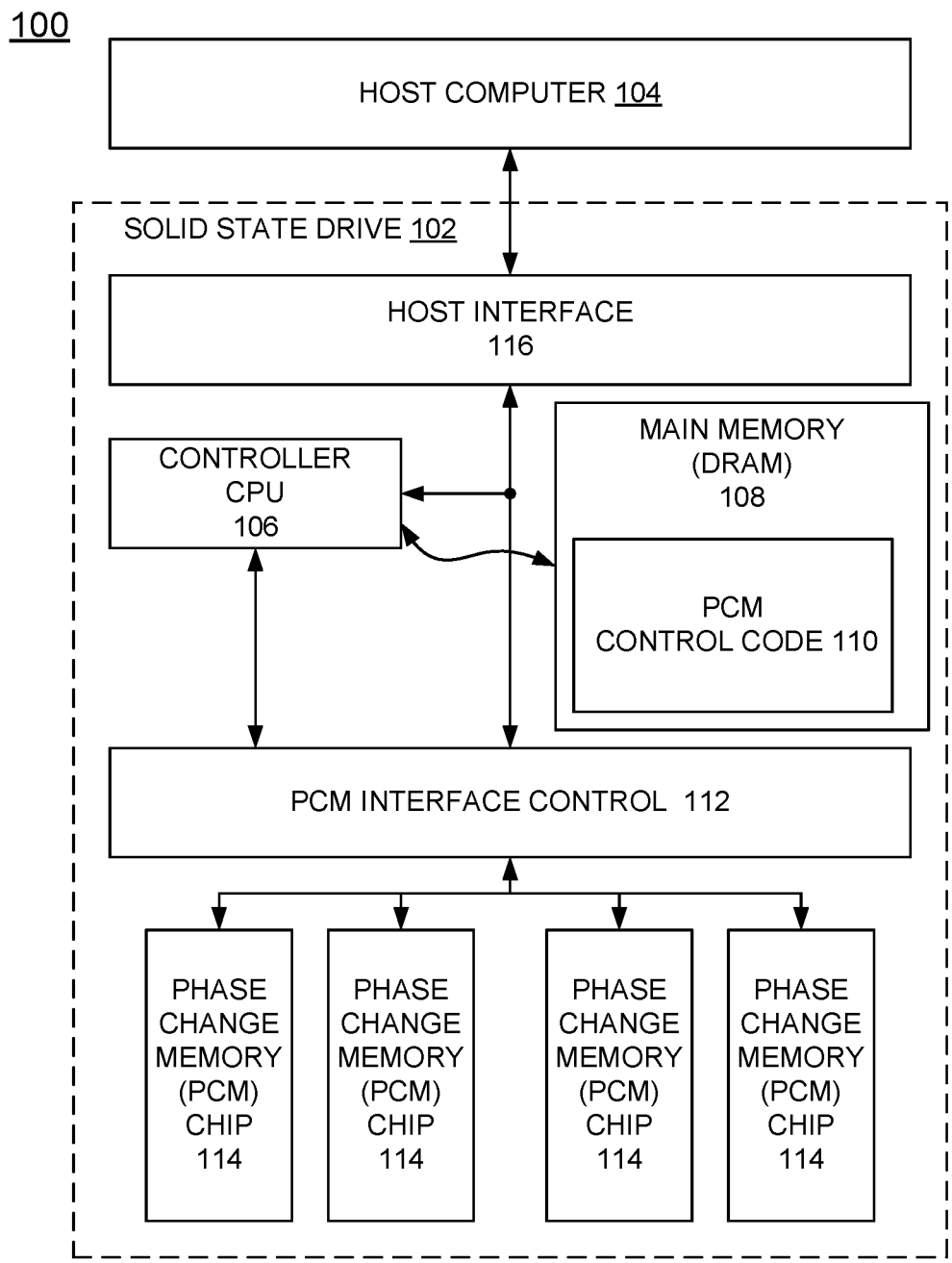
FIG. 1 is a block diagram representation illustrating a system for implementing enhanced performance methods for with read before write to phase change memory, for example, for solid state drives (SSDs) in accordance with preferred embodiments.

Having reference now to the drawings, in FIG. 1, there is shown an example system for implementing enhanced data write methods for phase change memory (PCM), for example, for solid state drives (SSDs) generally designated by the reference character 100 in accordance with preferred embodiments. System 100 includes a solid state drive 102 and a host computer 104. SSD 102 includes a controller 106 coupled to a main memory or dynamic random access memory (DRAM) 108, a phase change memory (PCM) control code 110 and a phase change memory (PCM) interface control 112.

SSD 102 includes a plurality of phase change memory (PCM) devices or chips 114 coupled to the PCM interface control 112, which are coupled to the controller 106. SSD 102 includes a host interface 116 coupled between the host computer 104, and the controller 106 and the phase change memory (PCM) interface control 112.

Although the example embodiment of system 100 is described in the context of the solid state drive 102, it should be understood that principles of the preferred embodiments advantageously are applied to other types of data storage devices including phase change memory (PCM).

System 100 is shown in simplified form sufficient for understanding preferred embodiments. For example, the controller 106 can be fabricated on one or multiple integrated circuit dies, and is suitably programmed to implement methods in accordance with preferred embodiments.

SSD 102 implements enhanced data write for phase change memory (PCM) using a read before write in accordance with preferred embodiments. The controller 106 of SSD 102 includes firmware, such as PCM control code 110, and is given direct access PCM interface control block 112. The firmware of controller 106 of SSD 102 is given information with respect to PCM interface control block 112, for example, from PCM control code 110.

Figure 2:
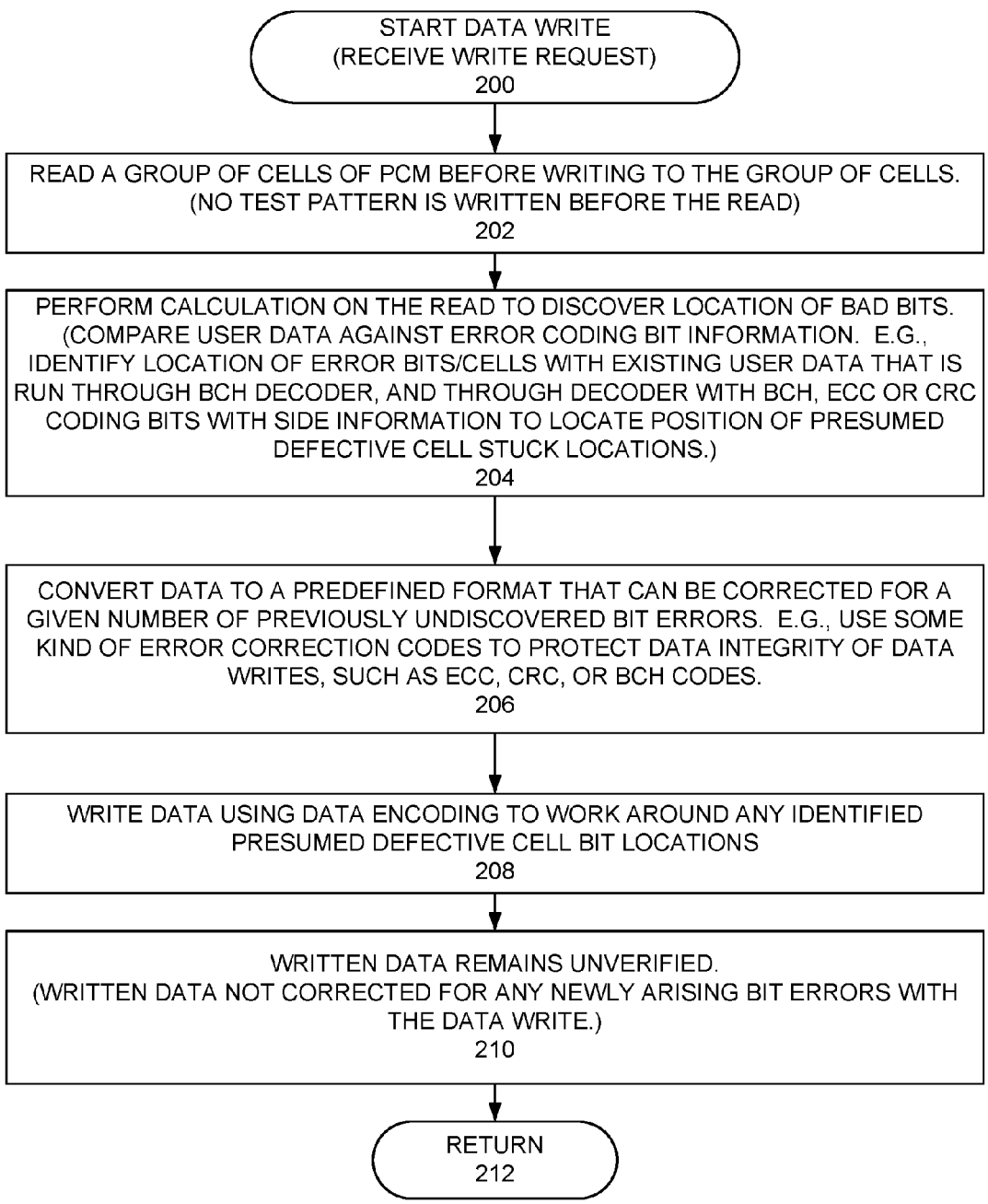
FIG. 2 is a flow chart illustrating example operations of the system of FIG. 1 for implementing enhanced performance read before write to phase-change-memory, for example, for solid state drives (SSDs) in accordance with preferred embodiments.

Referring now to FIG. 2, there is shown a flow chart illustrating example operations of the system of FIG. 1 for implementing enhanced performance including enhanced data write, for example, for solid state drives (SSDs) in accordance with preferred embodiments.

As indicated in a block 200, a data write starts in accordance with preferred embodiments, such as responsive to a received write request. Before writing data to a group of cells, the cells are quickly read without writing a test pattern before the read as indicated in a block 202.

A calculation is performed on the read to discover the location of any bad bits as indicated in a block 204. For example, existing user data that is read is run through the BCH decoder to eliminate the random errors, and then through the decoder of the scheme with side information to uncover the position of the stuck locations at block 204.

Before writing data to a group of cells, the data to be written is converted to a format that can correct for a given number of previously undiscovered bit errors as indicated in a block 206. For example, some kind of error correction codes are used to protect data integrity of the data writes to PCM, such as Error Correcting Code (ECC), Cyclic Redundancy Check (CRC), or BCH codes, which form a class of cyclic error-correcting codes.

As indicated in a block 208, the data write is performed using any identified presumed defective cell bit locations. The error cells bits identified from the existing user data that is read are presumed as defective cells and the data encoding scheme is chosen to work around these locations.

As indicated in a block 210, the data written to the PCM remains unverified. The data write in accordance with preferred embodiments maintains the written data without performing a second data write correcting any newly arising bit errors with the data write.

Figure 3:
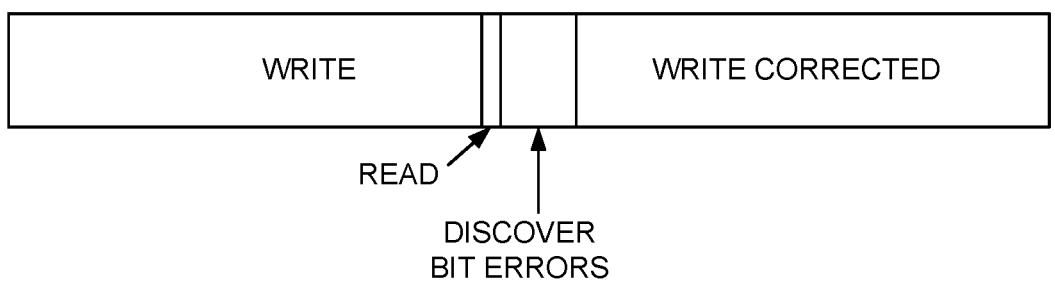
FIG. 3 illustrates a typical prior art data write to some known memory devices.

Referring now to FIG. 3, there is shown a typical prior art data write to some known memory devices. The typical procedure with older types of memories would be to write a block, read it back, perform some calculation to verify integrity or discover which bits are stuck, then write the corrected block again correcting any errors. Note that it may be necessary to perform two physical writes at this stage if all the stuck positions need to be discovered.

Figure 4:
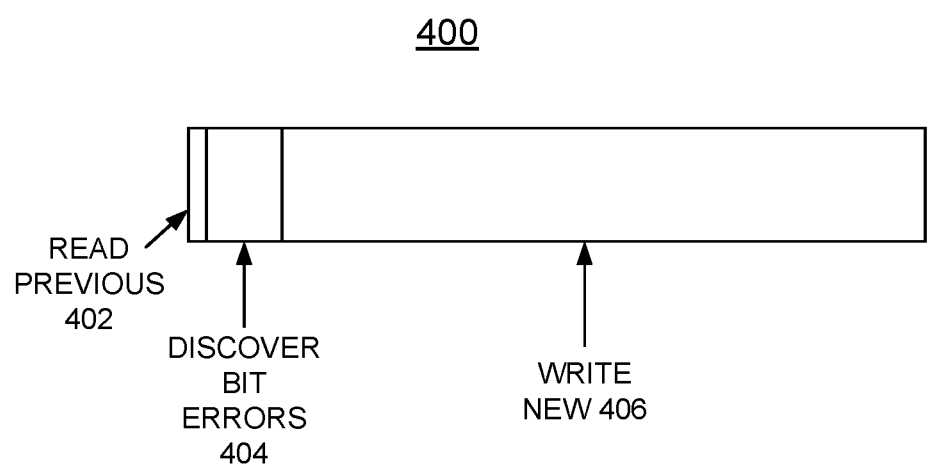
FIG. 4 illustrates a data write to phase-change-memory in accordance with preferred embodiments.

Referring now to FIG. 4, there is shown a data write to phase-change-memory generally designated by the reference character 400 in accordance with preferred embodiments. As indicated at READ PREVIOUS 402, the data write starts with a group of cells the cells read as shown at block 202 in FIG. 2. Next as indicated at DISCOVER BIT ERRORS 404, a calculation is performed on the read to discover the location of any bad bits as shown at block 204 in FIG. 2. The data write is performed as indicated at WRITE NEW 406 as shown at blocks 206, 208 in FIG. 2.

Figure 5:
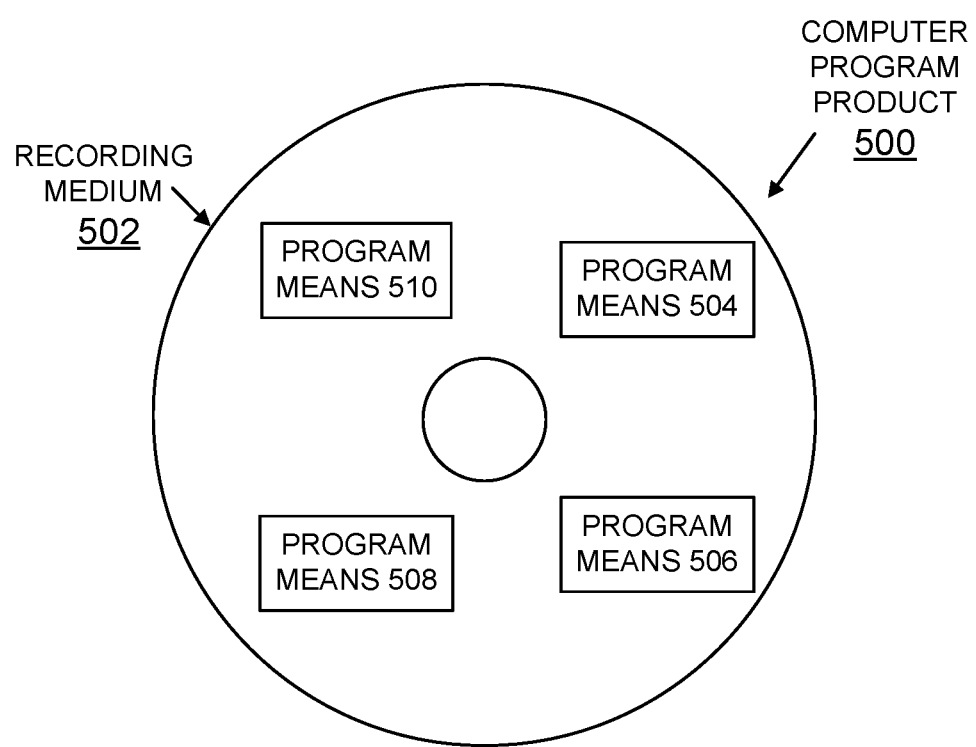
FIG. 5 is a block diagram illustrating a computer program product in accordance with preferred embodiments.

Referring now to FIG. 5, an article of manufacture or a computer program product 500 of the preferred embodiments is illustrated. The computer program product 500 includes a computer readable recording medium 502, such as, a floppy disk, a high capacity read only memory in the form of an optically read compact disk or CD-ROM, a tape, or another similar computer program product. Computer readable recording medium 502 stores program means or control code 504, 506, 508, 510 on the medium 502 for carrying out the methods for implementing enhanced performance for data write to Phase Change Memory (PCM) in accordance with preferred embodiments in the system 100 of FIG. 1.

A sequence of program instructions or a logical assembly of one or more interrelated modules defined by the recorded program means or control code 504, 506, 508, 510, direct SSD controller 106 of the system 100 for implementing enhanced performance with data write to PCM of preferred embodiments.

While the present invention has been described with reference to the details of the embodiments of the invention shown in the drawing, these details are not intended to limit the scope of the invention as claimed in the appended claims.

What is claimed is:

1. A method for implementing data write to phase-change-memory (PCM) in a system including phase-change-memory (PCM); a phase-change-memory (PCM) interface control coupled to said phase-change-memory (PCM); a controller coupled to said phase-change-memory (PCM) interface control for implementing data write to the phase-change-memory (PCM); said controller using said phase-change-memory (PCM) control code performing the steps of said method comprising:

starting a data write;

reading a group of PCM cells of the phase-change-memory (PCM) before writing to the group of cells and identifying any defective cells;

responsive to the identified defective cells, performing a data write for data being written to the PCM using data encoding to avoid writing to the identified defective cells; and responsive to performing the data write, maintaining the written data without error checking the data write and without performing another data write for correcting any newly arising bit errors with the data write.

2. The method for implementing data write as recited in claim 1 wherein starting the data write includes receiving a write request.

3. The method for implementing data write as recited in claim 1 wherein reading the group of PCM cells before writing to the group of cells to identify any defective cells before performing the data write includes performing a calculation to discover a location of each bad bit.

4. The method for implementing data write as recited in claim 3 includes reading existing user data for the group of PCM cells before writing to the group of cells, and comparing the existing user data against error correcting coding bit information with the existing user data run through a BCH decoder.

5. The method for implementing data write as recited in claim 4 wherein comparing the user data against error correcting coding bit information includes comparing user data against a selected one of an Error Correcting Code (ECC) bits and Cyclic Redundancy Check (CRC) bits to discover the location of each bad bit.

6. The method for implementing data write as recited in claim 1 wherein responsive to the identified defective cells, performing a data write for data being written to the PCM includes converting the data being written to a format enabling correction of a set number of bit errors using selected error correcting codes to protect data integrity.

7. An apparatus for implementing data write to phase-change-memory (PCM) comprising:
   a phase-change-memory (PCM);
   a phase-change-memory (PCM) interface control coupled to said phase-change-memory (PCM);
   a controller coupled to said phase-change-memory (PCM) interface control for implementing data write to the phase-change-memory (PCM);
   phase-change-memory (PCM) control code coupled to said controller;
   said controller using said phase-change-memory (PCM) control code performing the steps:
   starting a data write;
   reading a group of PCM cells of the phase-change-memory (PCM) before writing to the group of cells and identifying any defective cells;
   responsive to the identified defective cells, performing a data write for data being written to the PCM using data encoding to avoid writing to the identified defective cells; and
   responsive to performing the data write, maintaining the written data without error checking the data write and without performing another data write for correcting any newly arising bit errors with the data write.

8. The apparatus for implementing data write as recited in claim 7 includes said control code stored on a non-transitory computer readable medium.

9. The apparatus for implementing data write as recited in claim 7 includes said controller receiving a write request and starting the data write.

10. The apparatus for implementing data write as recited in claim 7 wherein said controller reading PCM cells before performing the data write includes said controller performing a calculation to discover a location of each bad bit.

11. The apparatus for implementing data write as recited in claim 10 includes said controller reading existing user data for the group of PCM cells before writing to the group of cells, and comparing the existing user data against error correcting coding bit information with the existing user data run through a BCH decoder.

12. The apparatus as recited in claim 11 wherein said controller comparing the existing user data against error correcting coding bit information with the existing user data run through a BCH decoder and further includes said controller comparing existing user data against a selected one of an Error Correcting Code (ECC) bits and Cyclic Redundancy Check (CRC) bits to discover the location of each bad bit.

13. The apparatus as recited in claim 7 wherein said controller responsive to the identified defective cells, performing a data write for data being written to the PCM includes said controller converting the data being written to a format enabling correction of a set number of bit errors using selected error correcting codes to protect data integrity.

14. A data storage device comprising:
   a phase-change-memory (PCM);
   a phase-change-memory (PCM) interface control coupled to said phase-change-memory (PCM);
   a controller coupled to said phase-change-memory (PCM) interface control for implementing data write to the phase-change-memory (PCM);
   phase-change-memory (PCM) control code coupled to said controller;
   said controller using said phase-change-memory (PCM) control code performing the steps:
   starting a data write;
   reading a group of PCM cells of the phase-change-memory (PCM) before writing to the group of cells and identifying any defective cells;
   responsive to the identified defective cells, performing a data write for data being written to the PCM using data encoding to avoid writing to the identified defective cells; and
   responsive to performing the data write, maintaining the written data without error checking the data write and without performing another data write for correcting any newly arising bit errors with the data write.

15. The data storage device as recited in claim 14, includes said control code stored on a non-transitory computer readable medium.

16. The data storage device as recited in claim 14, wherein said controller reading a group of PCM cells to identify any defective cells includes said controller reading existing user data for the group of PCM cells before writing to the group of cells, and comparing the existing user data against error correcting coding bit information with the existing user data run through a BCH decoder.

17. The data storage device as recited in claim 16, wherein said controller comparing the existing user data against error correcting coding bit information with the existing user data run through a BCH decoder and further includes said controller comparing existing user data against a selected one of an Error Correcting Code (ECC) bits and Cyclic Redundancy Check (CRC) bits to discover the location of each bad bit.

* * * * *